United States Patent
Kanoh et al.

(10) Patent No.: US 6,478,920 B1
(45) Date of Patent: *Nov. 12, 2002

(54) CHIP-TYPE CIRCUIT COMPONENT AND METHOD OF MANUFACTURING THE SAME

(75) Inventors: Osamu Kanoh; Masahiko Kawaguchi; Masahiro Bando; Atsuo Senda, all of Nagaokakyo (JP)

(73) Assignee: Murata Manufacturing Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/905,145

(22) Filed: Aug. 1, 1997

Related U.S. Application Data

(62) Division of application No. 08/632,735, filed on Apr. 15, 1996, now Pat. No. 5,699,025, which is a continuation of application No. 08/236,518, filed on Apr. 29, 1994, now abandoned.

(30) Foreign Application Priority Data

Apr. 30, 1993 (JP) ............................................. 5-1045032

(51) Int. Cl.[7] ............................................. B32B 31/00
(52) U.S. Cl. ........................ 156/250; 29/830; 29/846; 156/306.9; 156/319; 156/331.1; 156/331.5; 428/471
(58) Field of Search .................... 29/846, 830; 156/319, 156/331.1, 306.9, 250, 331.5; 428/471

(56) References Cited

U.S. PATENT DOCUMENTS

| | | | | |
|---|---|---|---|---|
| 3,061,501 A | * | 10/1962 | Dittman et al. | 156/250 |
| 3,416,994 A | * | 12/1968 | Chalmers et al. | 156/331.5 |
| 4,468,857 A | * | 9/1984 | Christian et al. | 156/250 |
| 5,412,865 A | * | 5/1995 | Takaoka et al. | 29/830 |

FOREIGN PATENT DOCUMENTS

| | | | | |
|---|---|---|---|---|
| JP | 62-53827 | | 3/1987 | |
| JP | 1-98253 | | 4/1989 | |
| JP | 4-297092 | * | 10/1992 | 29/830 |
| JP | 5-14101 | | 1/1993 | |

\* cited by examiner

Primary Examiner—John J. Gallagher
(74) Attorney, Agent, or Firm—Ostrolenk, Faber, Gerb & Soffen, LLP

(57) ABSTRACT

A chip-type circuit component comprising a chip body which is formed by bonding first and second substrates with each other. A polyimide adhesion layer is provided between the first and second substrates and a thin film circuit pattern is formed on at least one of a pair of main surfaces of the first and second substrates which are opposite each other, while an external electrode is formed on an end surface of the chip body to be electrically connected with the thin film circuit pattern.

6 Claims, 4 Drawing Sheets

CHIP-TYPE CIRCUIT COMPONENT AND METHOD OF MANUFACTURING THE SAME

This is a Division of application Ser. No. 08/632,735, filed Apr. 15, 1996, now U.S. Pat. No. 5,699,025, which is a Continuation of application Ser. No. 08/236,518, filed Apr. 29, 1994, now abandoned.

BACKGROUND OF THE INVENTION

1. Field of the Invention

The present invention relates to a chip-type circuit component comprising a pair of substrates and a thin film circuit pattern which is formed on at least one of opposite surfaces of the substrates, and a method of manufacturing the same.

2. Description of the Background Art

Examples of a chip-type circuit component comprising substrates and thin film circuit patterns which are formed on surfaces thereof are an inductance component, a band-pass filter, a high-frequency coil and a transformer. Such a conventional chip-type circuit component is formed by stacking a plurality of substrates, which are provided with thin film circuit patterns, with each other. For example, an inductance component is manufactured by forming a magnetic layer by printing paste which is mainly composed of ferrite, or preparing a green sheet which is mainly composed of ferrite, printing metal powder paste on the magnetic layer for forming a circuit pattern for inductance, stacking a plurality of such magnetic layers with each other for integrating the same, and firing the laminate as formed.

In such a method of manufacturing an inductance component, however, fine patterns cannot be obtained since the circuit patterns for inductance are formed by printing, and the inductance component is restricted in miniaturization since the degree of integration cannot be improved. Further, the laminate of the magnetic layers is fired at a temperature of about 1000° C. and hence cracking or breaking is caused by shrinkage of the magnetic layers. When the paste layers for forming the inductance circuit patterns are increased in thickness in order to reduce conductor resistance, evaporation of a solvent contained in the paste is increased to cause delamination between the magnetic layers during firing.

When the inductance component is integrally fired with paste or a green sheet consisting of a different ceramics material to be integrated with a capacitor component, further, substrates may be separated from each other at bonding surfaces therebetween due to a reaction during firing or due to a difference in rate of shrinkage.

SUMMARY OF THE INVENTION

An object of the present invention is to provide a highly reliable chip-type circuit component which can prevent occurrence of cracking, breaking and delamination, and a method of manufacturing the same.

The inventive chip-type circuit component comprises a first substrate, a second substrate which is bonded with the first substrate for forming a chip body, a polyimide adhesion layer which is provided between the first and second substrates, a thin film circuit pattern which is formed on at least one of opposite surfaces of the first and second substrates, and an external electrode which is formed on an end surface of the chip body to be electrically connected with the thin film circuit pattern.

The inventive method is adapted to manufacture the aforementioned chip-type circuit component according to the present invention.

According to a first aspect of the present invention, the method comprises a step of forming a thin film circuit pattern on at least one of opposite surfaces of first and second substrates, a step of applying polyamide resin varnish to at least one of the opposite surfaces of the first and second substrates, heat treating the polyamide resin varnish as applied for converting the same to polyimide, and a step of superposing the first and second substrates with each other to hold the surface of the first or second substrate coated with the polyamide resin varnish and heating the same in a vacuum to a temperature of 200 to 500° C. with application of a pressure of 10 to 100 kg/cm$^2$ in the direction of stacking, thereby bonding the first and second substrates with each other through a polyimide adhesion layer.

According to a second aspect of the present invention, the method comprises a step of forming a thin film circuit pattern on at least one of opposite surfaces of first and second substrates, and a step of superposing the first and second substrates while interposing a polyimide sheet between the opposite surfaces thereof and heating the same in a vacuum at a temperature of 200 to 500° C. with application of a pressure of 10 to 100 kg/cm$^2$ in the direction of stacking, thereby bonding the first and second substrates with each other through a polyimide adhesion layer formed by the polyimide sheet.

According to a third aspect of the present invention, the method comprises a step of bonding first and second mother substrates with each other through a polyimide adhesion layer for obtaining a mother chip body, and a step of cutting the mother chip body into independent chip bodies.

The first and second substrates employed in the present invention are not particularly restricted as long as the same are wable in a chip-type circuit component, and can be prepared from insulating substrates, magnetic substrates or dielectric substrates. In general, a mother substrate is cut and worked into independent chip components. In this case, the mother substrate is two inches square in size, for example. The first and second substrates preferably have flat opposite surfaces, since the same are bonded with each other. In more concrete terms, the opposite surfaces of the first and second substrates are preferably not more than 100 $\mu$m/2 inch square in flatness. Such flatness of the surfaces is measured by an optical wave interference type flatness tester. The substrates are made to have flat opposite surfaces so that no unadhering portion is caused when the substrates are bonded with each other through an adhesive, and no cracking is caused when a pressure is applied. The surfaces are preferably flat also for improving dimensional accuracy in patterning by contact exposure in formation of the thin film circuit pattern.

According to the present invention, the surface of each substrate preferably has a center line average height of not more than 2.0 $\mu$m. The center line average height of the surface is measured by a tracer type surface roughness tester. If the substrate surface exceeds 2.0 $\mu$m in center line average height, microcracks are easily caused in adhesion. Further, the center line average height is preferably reduced also for improving accuracy in photoetching of the circuit pattern. The surface may be subjected to mirror finish polishing, for example, to be reduced in center line average height. In order to further improve adhesion strength, the center line average height is preferably reduced to about 0.2±0.05 $\mu$m.

According to the present invention, variation in thickness of the substrates is preferably not more than 1%. It is possible to improve electrical properties such as capacitance, reactance and the coupling factor by reducing the variation in thickness.

According to the present invention, it is possible to form the circuit pattern on at least one of the first and second substrates by patterning a thin film, which is formed by sputtering, vapor deposition or plating, by photoetching or the like. Examples of the circuit pattern are various circuit patterns such as those of an inductance, a capacitor, a resistor, and a distributed-constant circuit and a concentrated-constant circuit thereof.

According to the first aspect of the present invention, the polyimide adhesion layer is prepared from polyamide resin varnish. This polyamide resin varnish is applied to at least one of the first and second substrates, and heat treated in the air or inert gas. Thus, the polyamide resin varnish is dewatered and dried with evaporation of a solvent contained therein, and converted to polyimide, to be improved in adhesiveness and adhesion strength. When the polyamide resin varnish is dried in inert gas, it is possible to prevent a metal forming the circuit pattern from oxidation.

When the temperature is too high or the treatment time is too long in the heat treatment, resin hardening progresses to cause difficulty in adhesion. Therefore, the polyamide resin varnish is preferably heat treated for about 1 hour, to be heated to a temperature of about 230° C. The polyamide resin varnish is preferably applied in a thickness of about 3 to 100 μm, not to exert influence on the electrical properties. Further, dispersion in thickness of application of the polyamide resin varnish is preferably within a range of ±5 μm, to cause no unadhering portion.

According to the second aspect of the present invention, the polyimide adhesion layer is formed by the polyimide sheet. It is possible to bond the first and second substrates with each other by heating the polyimide sheet, which has thermal plasticity itself. Therefore, it is not necessary to evaporate a solvent by heating, dissimilarly to the polyamide resin varnish. The thickness of the polyimide sheet is preferably within a range of 3 to 100 μm.

In each of the first and second aspects of the present invention, the first and second substrates are superposed with each other and subjected to a pressure of 10 to 100 kg/cm², more preferably 40 to 50 kg/cm², in the direction of stacking. An excessively low pressure may result in unadhering portions, while an excessively high pressure may result in cracking of the substrates. Application of the pressure may be started from an ordinary temperature, or after the substrates are heated to a temperature allowing adhesion such as 200° C., for example. The pressure is preferably reduced after the temperature is reduced below 100° C. In this case, the pressure is preferably increased and reduced at a rate of 1 kg/cm²·sec.

According to each of the first and second aspects of the present invention, the first and second substrates are superposed and heated preferably at a programming rate in a range of 5 to 20° C./min. If the programming rate is too low, hardening of the polyimide so progresses that the substrates may not be bonded with each other due to increase in the temperature allowing adhesion. When the programming rate is too high, on the other hand, irregularity in temperature is caused in the heating furnace to easily cause irregularity in temperature in or between the substrates.

In each of the first and second aspects of the present invention, the first and second substrates are superposed and heated in a vacuum. The degree of vacuum is preferably within a range of 10 to 1×10⁻⁶ Torr. It is possible to eliminate gas from the polyimide adhesion layer for avoiding occurrence of voids by pressurizing and bonding the substrates with evacuation. Further, it is possible to avoid a bad influence on a metal film for forming an electrode by carrying out degassing. Since the polyimide which is applied to the adhesion layer in the present invention has heat resistance, it is possible to retard deterioration by high temperature and prevent cracking or breaking caused by heat shock in heating and cooling by employing such a polyimide adhesion layer. Thus, it is possible to obtain a highly reliable chip-type circuit component.

The polyimide which is applied to the adhesion layer for bonding the first and second substrates with each other according to the present invention is excellent in moisture resistance and heat resistance. Therefore, it is possible to prevent breaking caused by heat shock in a heat cycle test, for example, thereby obtaining a highly reliable chip-type circuit component. Due to the high heat resistance, further, it is possible to form an external electrode on the chip body by high-temperature treatment such as sputtering or vapor deposition, for example. Furthermore, it is possible to solder a chip-type circuit component to a printed-circuit board by reflow soldering or flow soldering. In the method according to the present invention, the first and second substrates are superposed with each other and heated in a vacuum to a temperature of 200 to 500° C. with application of a pressure of 10 to 100 kg/cm² in the direction of stacking, to be altered each other. Thus, it is possible to improve adhesiveness and adhesive properites, while reliably preventing occurrence of cracking or the like. Further, it is possible to prevent a bad influence exerted by gas generated from the adhesion layer upon heating, while making the adhesion layer more uniform in thickness. Thus, it is possible to improve the electrical properties of the chip-type circuit component.

According to the present invention, the first and second substrates are bonded with each other through the polyimide adhesion layer, whereby it is possible to bond substrates of different ceramics materials with each other. Therefore, it is possible to integrate an inductance component and a capacitor component with each other, for example.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
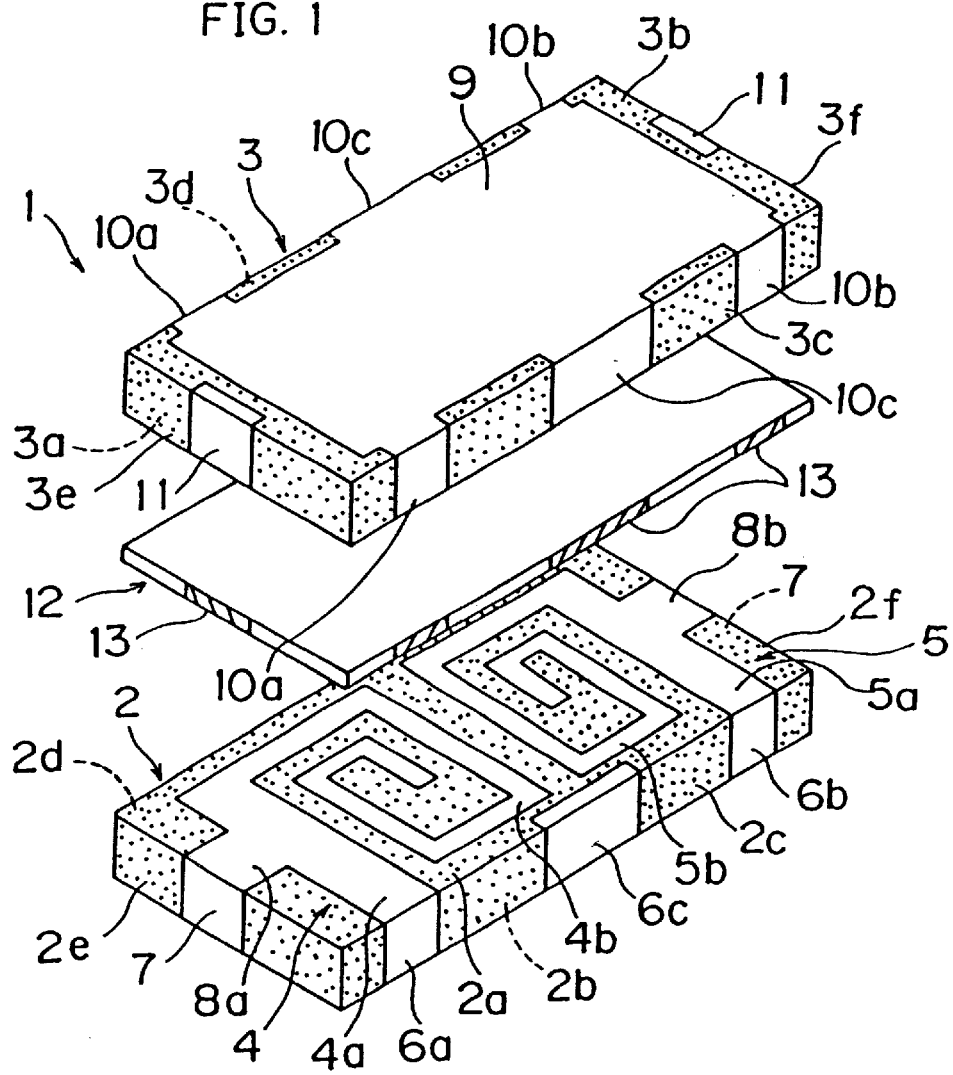
FIG. 1 is an exploded perspective view showing a chip-type circuit component according to an embodiment of the present invention.
Figure 2:
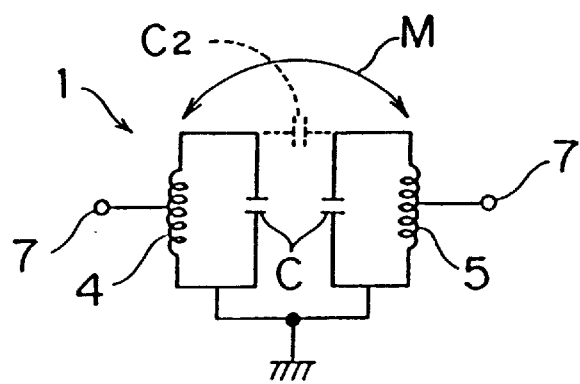
FIG. 2 is an equivalent circuit diagram of the embodiment shown in FIG. 1.

FIG. 1 is an exploded perspective view showing an embodiment of the present invention. In this embodiment, the present invention is applied to a chip-type band-pass filter 1. Referring to FIG. 1, the band-pass filter 1 is formed by bonding first and second dielectric substrates 2 and 3 with each other. Spiral circuit patterns 4 and 5 are formed on a major surface 2a of the first dielectric substrate 2. These circuit patterns 4 and 5 are symmetrical to each other. FIG. 2 is an equivalent circuit diagram of the embodiment shown in FIG. 1. As shown in FIG. 2, the circuit patterns 4 and 5 are inductively coupled with each other to form a two-stage band-pass filter.

Figure 3:
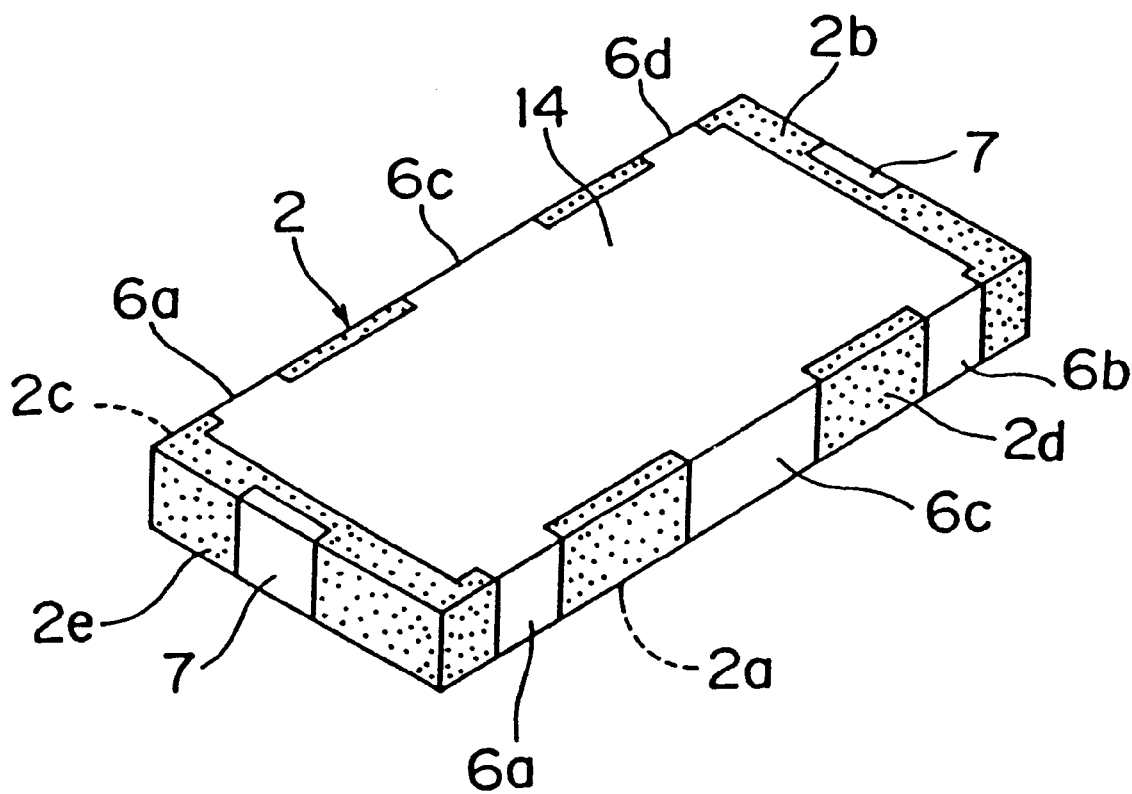
FIG. 3 is a perspective view showing a rear surface of a first substrate in the embodiment shown in FIG. 1.

FIG. 3 is a perspective view showing a rear side of the first dielectric substrate 2 shown in FIG. 1. As shown in FIG. 3, a shield electrode 14 is formed on another major surface 2b of the first dielectric substrate 2. This shield electrode 14 is connected to end portions 4a and 5a of the circuit patterns 4 and 5 through ground terminal electrodes 6a and 6a which are formed on a side surface 2c of the substrate 2. Further, a ground terminal electrode 6c is formed on the center of the side surface 2c of the substrate 2. This ground terminal electrode 6c is connected to the shield electrode 14. As shown in FIG. 3, another side surface 2d of the first substrate 2 is also provided with ground terminal electrodes 6a, 6a and 6c which are electrically connected with the shield electrode 14.

Referring again to FIG. 1, a prescribed gap is defined between the ground terminal electrode 6c and corner portions 4b and 5b of the circuit patterns 4 and 5, to form capacitance C. Input/output electrodes 7 are formed on both end surfaces 2e and 2f of the first substrate 2 respectively. These input/output electrodes 7 are connected to the circuit patterns 4 and 5 through lead electrodes 8a and 8b respectively.

Another shield electrode 9 is formed on a major surface 3b, which is an upper surface, of the second dielectric substrate 3. Opposite side surfaces 3c and 3d of the second substrate 3 are provided with ground terminal electrodes 10a to 10c respectively. These ground terminal electrodes 10a to 10c are connected to the shield electrode 9. Further, input/output electrodes 11 are formed on both end surfaces 3e and 3f of the second substrate 3.

An adhesion layer 12 of polyimide is provided between the first and second dielectric substrates 2 and 3. The major surfaces 2a and 3a of the first and second substrates 2 and 3 are bonded with each other through the polyimide layer 12. The polyimide adhesion layer 12 is provided on respective side surfaces thereof with electrodes 13 in portions corresponding to the input/output electrodes 7 and 11 and the ground terminal electrodes 6a to 6c and 10a to 10c respectively. The input electrodes 11 and 7 are electrically connected with each other by the electrodes 13. Further, the ground terminal electrodes 6a to 6c and 10a to 10c are also electrically connected with each other by the electrodes 13 respectively.

The major surfaces 2a, 2b, 3a and 3b of the first and second dielectric substrates 2 and 3 are not more than 10 µm in flatness, and not more than 0.3 µm in center line average height. Due to such flatness and center line average height, the substrates 2 and 3 are improved in bond strength and the adhesion layer 12 is made more uniform in thickness.

An exemplary method of manufacturing the band-pass filter 1 according to the embodiment of the present invention shown in FIG. 1 is now described.

Figure 4:
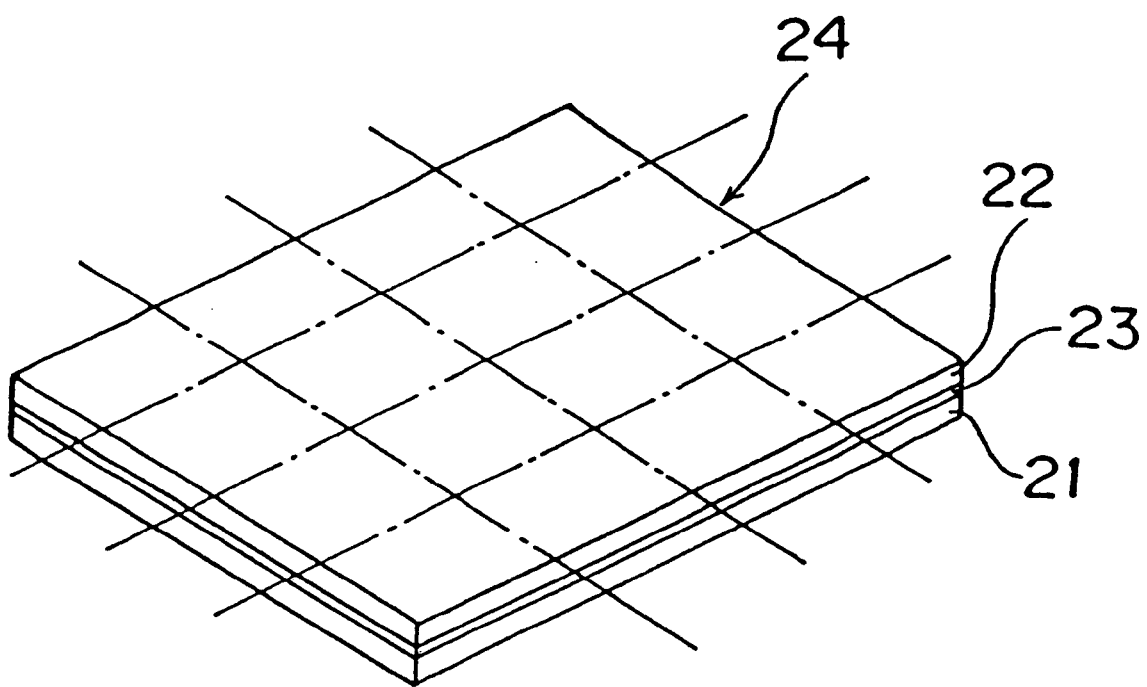
FIG. 4 is a perspective view for illustrating an embodiment of a method according to the present invention.

FIG. 4 shows a mother chip body 24, which is formed by bonding first and second mother substrates 21 and 22 with each other through a mother polyimide adhesion layer 23. It is possible to obtain individual chip bodies by cutting such a mother chip body 24 along one-dot chain lines shown in FIG. 4 by a method such as dicing. According to this embodiment, the first mother substrate 21 is formed by a dielectric substrate of 0.6 mm in thickness, which is made of $Nd_2O_3$—$BaO$—$TiO_2$ ceramics having a dielectric constant $\epsilon$ of 70 to 120. Both major surfaces of the first mother substrate 21 are polished to be not more than 10 µm in flatness and not more than 0.3 µm in center line average height. NiCr thin films for serving as underlayers are formed on both major surfaces of the first mother substrate 21 in thicknesses of 500 Å by sputtering. Further, Ag films are formed on the NiCr layers in thicknesses of 5 µm by sputtering. Unnecessary portions of the metal films as formed are removed by photoetching, thereby forming patterns corresponding to the circuit patterns 4 and 5 and the lead electrodes 8a and 8b on one of the major surfaces. Further, a shield electrode and cutting markers are formed on the other major surface.

The second mother substrate 22 is formed by a dielectric substrate of 0.5 mm, which is made of $MgO$—$CaO$—$TiO_2$ ceramics having a dielectric constant $\epsilon$ of 20. Both major surfaces of this dielectric substrate are polished to be not more than 10 µm in flatness and not more than 0.3 µm in center line average height.

Polyamide resin varnish is applied onto opposite surfaces of the first and second mother substrates 21 and 22 respectively. This polyamide resin varnish is so applied that the layers as formed are 5 to 10 µm in thickness after drying. The layers of the polyamide resin varnish are dried and the substrates 21 and 22 are heated in an inert atmosphere of $N_2$ or Ar to a temperature of 230° C. Due to this heating, a solvent contained in the varnish is evaporated and the polyamide resin varnish is converted to polyimide. The first and second mother substrates 21 and 22 are so superposed that the surfaces of the dried polyimide layers face to each other.

Then, a pressure of 40 to 50 kg/cm² is applied to the first and second mother substrates 21 and 22 as superposed with each other in the direction of stacking, and the substrates 21 and 22 are arranged in a heating furnace. The heating furnace is maintained at a degree of vacuum of 10 to $1 \times 10^{-6}$ Torr, to heat the substrates 21 and 22 to a temperature of 230 to 450° C. at a programming rate of 5 to 20° C./min. Thus, the first and second mother substrates 21 and 22 are bonded to each other to provide the mother chip body 24 which is in a bonded state through the mother polyimide adhesion layer 23, as shown in FIG. 4.

The mother chip body 24 shown in FIG. 4 is set in a dicing machine, to be diced along the markers. Thus obtained are chip bodies in the form of rectangular parallelepipeds of 3.2 by 1.6 by 1.1 (t)mm. The end portions 4a and 5a of the circuit patterns 4 and 5 and end surfaces of the lead electrodes 8a and 8b are exposed on side surfaces of each of the chip bodies as obtained.

Then, the shield electrode 9, the ground electrodes 6a to 6c and 10a to 10c, the input/output electrodes 7 and the electrodes 13 shown in FIG. 1 are formed on each chip body [as obtained] by sputtering. In more concrete terms, portions provided with no metal films are covered with masks, NiCr films of 500 Å in thickness are formed as underlayers, NiCu films of 3 µm in thickness are formed thereon and Ag films of 1 µm in thickness are further formed thereon.

Thus, it is possible to manufacture the band-pass filter 1 according to the embodiment of the present invention as shown in FIG. 1.

In the band-pass filter 1 according to the present invention, the major surfaces of the first and second substrates 2 and 3 are not more than 10 µm in flatness, and not more than 0.3 µm in center line average height. Thus, it is possible to improve bond strength for bonding the substrates 2 and 3 with each other. Further, it is possible to reduce dispersion in thickness of the polyimide adhesion layer 12. Consequently, it is possible to solve problems in bonding of the substrates 2 and 3, thereby improving frequency characteristics and electrical properties such as insertion loss.

According to this embodiment, the substrates 2 and 3 are superposed with each other through the polyimide adhesion layer 12, whereby it is possible to reliably prevent occurrence of cracking or breaking caused by heat shock in a heat cycle test or the like. According to this embodiment, further, the mother substrates 21 and 22 are heated in a vacuum, whereby it is possible to prevent a bad influence by gas in the adhesion layer 12, thereby improving the electrical properties. Thus, it is possible to obtain a highly reliable circuit component.

According to this embodiment, the circuit patterns 4 and 5 are held by the two substrates 2 and 3, whereby the same are not damaged by external force and can be easily handled. Further, the first and second substrates 2 and 3 can be made of different materials, to further improve the degree of freedom in product design.

Figure 5:
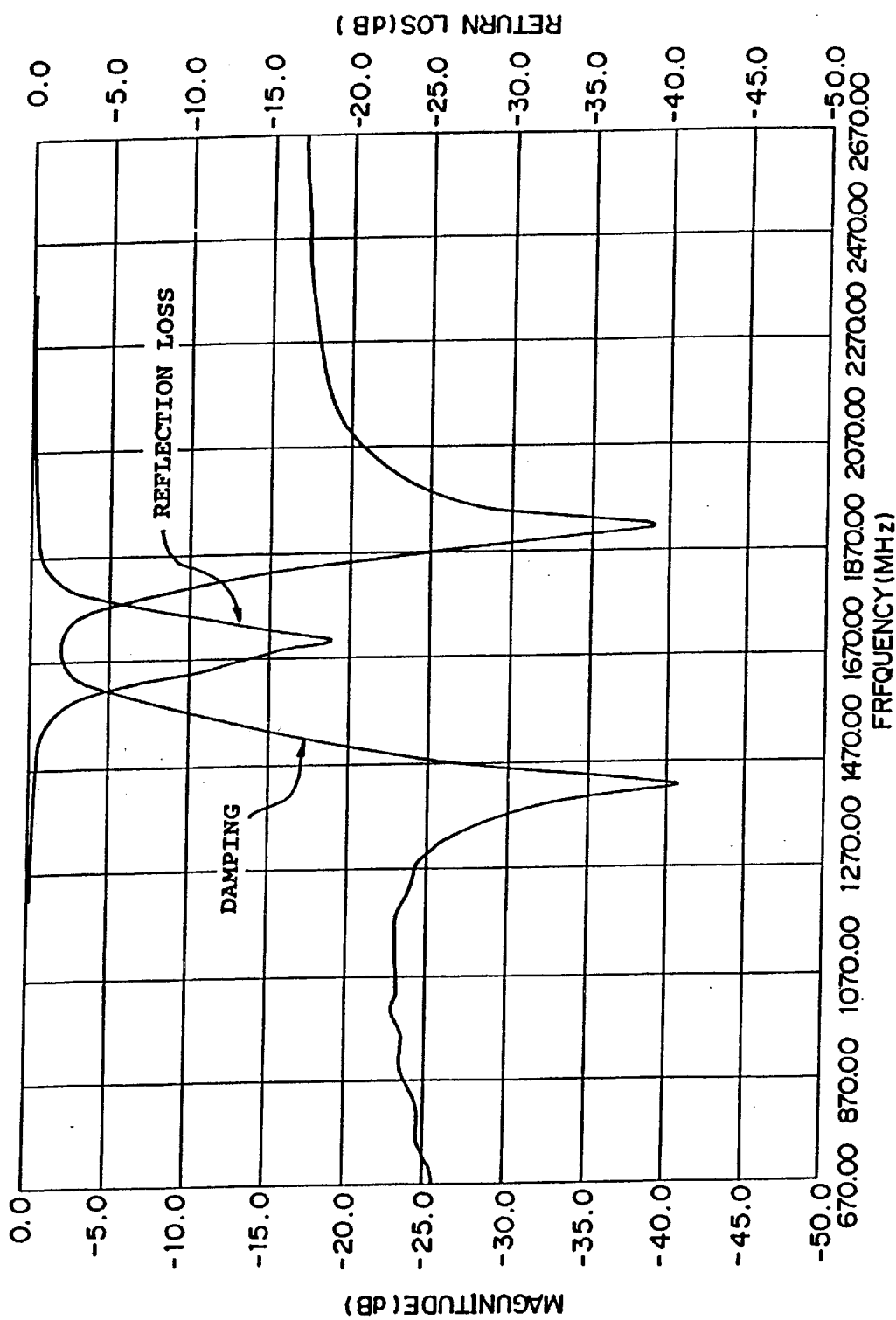
FIG. 5 is a characteristic diagram of a band-pass filter in the embodiment shown in FIG. 1.

FIG. 5 illustrates characteristics of the band-pass filter 1 according to this embodiment. As clearly understood from FIG. 5, the band-pass filter 1 has a center frequency $f_0$ of 1.69 GHz, insertion loss ($f_0$) of about 2.0 dB, and a −3 dB bandwidth of about 150 MHz. Thus, it is understood that the band-pass filter 1 has excellent characteristics.

While polyamide resin varnish is applied onto the substrates to form the polyimide adhesion layer in the aforementioned embodiment, it is also possible to obtain a mother chip body having the structure shown in FIG. 4 by superposing first and second mother substrates with each other through a polyimide sheet in place of applying the polyamide resin varnish, and heat treating the same. It is possible to obtain the chip-type circuit component according to the present invention from the mother chip body as obtained, similarly to the above.

Although the present invention is applied to a band-pass filter in the aforementioned embodiment, the inventive circuit component is not restricted to such a band-pass filter. The present invention is also applicable to a coil, a transformer or a common mode choke coil, for example, to attain excellent electrical properties similarly to the aforementioned embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a chip-type circuit component comprising a first substrate and a second substrate each having a major surface capable of receiving a thin film circuit pattern thereon; a polyimide adhesion layer bonding said first and second substrates so that the entirety of said major surfaces of said first and second substrates are opposed and bonded to each other, thereby forming a chip body; a thin film circuit pattern on at least one of said major surfaces of said first and second substrates; and an external electrode on a side surface of said chip body, electrically connected with said thin film circuit pattern, said method comprising:

forming said thin film circuit pattern on at least one of said major surfaces;

applying polyamide resin varnish onto at least one of said major surfaces;

heat treating said applied polyamide resin varnish for converting the same to said polyimide adhesion layer;

superposing said major surfaces in a face to face relationship and heating said substrates in a vacuum to a temperature of 200 to 500° C. while applying a pressure of 10 to 100 kg/cm along the direction of stacking, thereby bonding said first and second ceramic substrates with each other through said polyimide adhesion to prepare said chip body; and forming said external electrode on said side surface of said chip body such that said external electrode comprises respective electrode portions on said substrates and on said polyimide adhesion layer which are conductively connected to each other.

2. A method of manufacturing a chip-type circuit component comprising a first substrate and a second substrate each having a major surface capable of receiving a thin film circuit pattern thereon; a polyimide adhesion layer bonding said first and second substrates so that the entirety of said major surfaces of said first and second substrates are opposed and bonded to each other, thereby forming a chip body; a thin film circuit pattern on at least one of said major surfaces of said first and second substrates; and an external electrode on a side surface of said chip body, electrically connected with said thin film circuit pattern, said method comprising:

forming said thin film circuit pattern on at least one of said major surfaces;

superposing said major surfaces in a face to face relationship with a polyimide sheet being located therebetween and heating said substrates in a vacuum to a temperature of 200 to 500° C. while applying a pressure of 10 to 100 kg/cm along the direction of stacking, thereby bonding said first and second substrates with each other through said polyimide sheet which acts as a polyimide adhesion layer to prepare said chip body; and forming an external electrode on said side surface of said chip body such that said external electrode comprises respective electrode portions on said substrates and on said polyimide adhesion layer which are conductively connected to each other.

3. A method of manufacturing a plurality of chip-type circuit components, each of said chip-type circuit components comprising a first substrate and a second substrate each having a major surface capable of receiving a thin film circuit pattern thereon; a polyimide adhesion layer bonding said first and second substrates so that the entirety of said major surfaces of said first and second substrates are opposed and bonded to each other, thereby forming a chip body; a thin film circuit pattern on at least one of said major surfaces of said first and second substrates; and an external electrode on a side surface of said chip body, electrically connected with said thin film circuit pattern, said method comprising:

preparing first and second mother ceramic substrates, each having a major surface;

forming a thin film circuit pattern on at least one of said major surfaces;

applying polyamide resin varnish onto at least one of said major surfaces;

heat treating said applied polyamide resin varnish for converting the same to polyimide;

superposing said major surfaces in a face to face relationship and heating said substrates in a vacuum to a temperature of 200 to 500° C. while applying a pressure of 10 to 100 kg/cm along the direction of stacking, thereby bonding said first and second ceramic substrates with each other through a polyimide adhesion layer formed by said polyimide to prepare said mother chip body;

cutting said mother chip body into said chip bodies; and forming respective external electrode on said side surface of each of said chip bodies, said external electrode comprises respective electrode portions on said substrates and on said polyimide adhesion layer which are conductively connected to each other.

4. The method of manufacturing a chip-type circuit component in accordance with claim 3, wherein said cutting step comprises a step of cutting said mother chip body by dicing.

5. A method of manufacturing a plurality of chip-type circuit components, each said chip-type component comprising a first substrate and a second substrate each having a major surface capable of receiving a thin film circuit pattern thereon; a polyimide adhesion layer bonding said first and second substrates so that the entirety of said major surfaces of said first and second substrates are opposed and bonded to each other, thereby forming a chip body; a thin film circuit pattern on at least one of said major surfaces of said first and second substrates; and an external electrode on a side surface of said chip body, electrically connected with said thin film circuit pattern, said method comprising:

preparing first and second mother ceramic substrates, each having a major surface;

forming a thin film circuit pattern on at least one of said major surfaces;

superposing said major surfaces in a face to face relationship with a polyimide sheet being located therebetween and heating said substrates in a vacuum to a temperature of 200 to 500° C. while applying a pressure of 10 to 100 kg/cm along the direction of stacking, thereby bonding said first and second mother ceramic substrates with each other through a polyimide adhesion layer formed by said polyimide sheet to prepare said mother chip body;

cutting said mother chip body into said chip bodies; and forming respective said external electrodes on said side surface of each of said chip bodies, said external electrode comprises respective electrode portions on said substrates and on said polyimide adhesion layer which are conductively connected to each other.

6. The method of manufacturing a chip-type circuit component in accordance with claim 5, wherein said cutting step comprises a step of cutting said mother chip body by dicing.

\* \* \* \* \*